United States Patent [19]

Yamamoto et al.

[11] Patent Number: 4,554,573

[45] Date of Patent: Nov. 19, 1985

[54] GLASS-SEALED CERAMIC PACKAGE TYPE SEMICONDUCTOR DEVICE

[75] Inventors: Hideharu Yamamoto, Tokyo; Hiroshi Tsuneno, Sayama, both of Japan

[73] Assignee: Hitachi, Ltd., Tokyo, Japan

[21] Appl. No.: 563,617

[22] Filed: Dec. 20, 1983

Related U.S. Application Data

[62] Division of Ser. No. 306,863, Sep. 29, 1981, Pat. No. 4,437,228.

[30] Foreign Application Priority Data

Oct. 1, 1980 [JP] Japan ................................ 55-135869

[51] Int. Cl.⁴ ..................... H01L 21/58; H01L 21/52; H01L 23/08; H01L 23/54
[52] U.S. Cl. ...................................... 357/73; 357/80; 357/71; 357/67
[58] Field of Search ........................ 357/73, 80, 67, 71

[56] References Cited

U.S. PATENT DOCUMENTS

| | | | |
|---|---|---|---|
| 3,256,465 | 6/1966 | Weissenstern et al. | 357/80 |
| 3,793,064 | 2/1974 | Budd et al. | 357/80 |
| 4,376,287 | 3/1983 | Sechi | 357/80 |
| 4,401,767 | 3/1983 | Dietz et al. | 357/67 |

FOREIGN PATENT DOCUMENTS 0042260 3/1983 Japan .................................. 357/73

OTHER PUBLICATIONS

"Metal Glaze Conductor"-IBM Technical Disclosure Bulletin-Stevens-vol. 12, No. 10, Mar. 1970.

*Primary Examiner*—Andrew J. James
*Assistant Examiner*—Sheila V. Clark
*Attorney, Agent, or Firm*—Antonelli, Terry & Wands

[57] ABSTRACT

A semiconductor device in which a silicon pellet is mounted on a ceramic substrate by means of a glass material of low melting point. To prevent the silicon pellet from being destroyed under thermal stress, the pellet is bonded to the glass material of low melting point through interposition of an adhesion reinforcing film such as an aluminum film capable of exhibiting a good wettability and a great bonding strength.

9 Claims, 4 Drawing Figures

GLASS-SEALED CERAMIC PACKAGE TYPE SEMICONDUCTOR DEVICE

This is a division of application Ser. No. 306,863, filed Sept. 29, 1981, now U.S. Pat. No. 4,437,228.

The present invention relates in general to a semiconductor device. In more particular, the invention concerns a structure in which a semiconductor element is adhesively bonded or bound to a substrate of ceramic package by means of a glass material of a low melting point and a method of implementing the structure.

In general, the process of mounting a silicon semiconductor element (usually referred to as a pellet) on a substrate of package by using a glass adhesive which has a low melting point and hence exhibits a low work or bonding temperature of about 550° C. or less is adopted in fabrication of semiconductor devices of a glass-sealed ceramic package type in which a ceramic substrate and a ceramic cap are hermetically bonded together by the glass adhesive. In such method of directly mounting a semiconductor element on an insulation substrate by means of the glass adhesive having a low melting point for manufacturing semiconductor devices inclusive of the glass-sealed ceramic type semiconductor device mentioned above, it is known that the pellet is likely to undergo destruction, when there is a great difference in thermal expansion coefficient between the semiconductor element or the pellet and a base assembly which includes the low-melting-point glass film and to which the semiconductor element or pellet is to be adhesively bonded. Even if the difference in thermal expansion coefficient is of an insignificant degree, the semiconductor element or pellet of a great size will nevertheless be destroyed under the thermal stress of great magnitude possibly produced upon temperature transition from the pellet bonding temperature to a room temperature or possibly induced due to remarkable changes in the ambient temperature to which the completed semiconductor device is exposed.

By the way, it has not heretofore been made clear in what mechanism the pellet leads to destruction. Under the circumstances, the semiconductor element bonding process which makes use of the glass adhesive of a low melting point and provides a great advantage in that the manufacturing cost can be significantly reduced, as generally known in the art, is restricted in practical applications by the size of the pellet and/or the type of material of the base assembly. For example, in the case of manufacturing the ceramic package type semiconductor device by bonding a silicon pellet onto a ceramic substrate by means of a glass adhesive according to a hitherto known method, it was practically impossible to attain successfully the bonding, because of generation of cracks in the pellet, when the pellet is of a size greater than about $3.0 \times 3.0$ mm$^2$.

An object of the present invention is to eliminate the shortcomings of the hitherto known technique described above and to allows a semiconductor element or pellet of a large size to be mounted on a base substrate by using a low-melting-point glass adhesive without involving destruction of the semiconductor element even when there exists a great difference in thermal expansion coefficient between the semiconductor element and the base assembly.

The teaching of the invention disclosed herein is based on the results of experiments and analytical studies performed by the inventors with a view to investigating the mechanism of destruction or generation of cracks in the silicon semiconductor element or silicon pellet in the hitherto known bonding method in which the glass adhesive of a low melting point is used. It has been found after a succession of intensive studies that the phenomenon of the pellet (i.e. semiconductor element) being destroyed can be explained by the fact that the bonding strength or force acting between silicon (Si) constituting the pellet and a glass film of a low melting point deposited previously on a surface of the ceramic substrate as a constituent of the base assembly is rather feeble, as the result of which peeling-off or delamination will easily occur in the bond between silicon and the glass film of the low melting point under influence of the thermal stress, whereby concentration of stress is brought about at the interface of peeled-off or delaminated region to thereby give rise to generation of cracks and eventual destruction of the pellet. For having a better understanding of the invention, this phenomenon will be described in more detail in conjunction with FIG. 1. Referring to the figure, it is assumed that a silicon pellet 4 having circuit elements implemented on the top surface thereof is to be bonded to a ceramic substrate 1 having a glass film 2 of a low melting point formed previously thereon by melting the glass film 2 at an ambient temperature in the range of ca. 400° C. to ca. 450° C. In this case, upon cooling of the glass film 2, a compressing force indicated by an arrow P is produced due to the difference in thermal coefficient between the glass film 2 and the silicon pellet 4 and acts to bend the silicon pellet 4. In this connection, it is to be noted that the thermal expansion coefficient of silicon is about $3.5 \times 10^{-6}/°C.$, while that of the glass adhesive of the low melting point is in a range of about $5 \times 10^{-6}$ to $6 \times 10^{-6}/°C.$ Because of an inadequate bonding strength or force acting between the glass film 2 and the silicon pellet 4, peeling-off or delamination will occur in a region A, resulting in that stress is concentrated in the interior of the silicon pellet 4 at the interface E of the delaminated region A, giving rise to generation of a crack C.

The invention starts from the results of investigation described above and is based on the fact that the concentration of stress in the silicon pellet and hence destruction thereof due to the local delamination or peeling-off can be positively prevented when the silicon pellet is bonded to the adhesive glass film of a low melting point so solidly that no delamination takes place.

According to the invention, it is taught that a bond or adhesion reinforcing film of a material which exhibits a good wettability to the low-melting-point glass film and is capable of producing a greater adhesion or bonding strength than silicon is previously formed on a rear or lower surface of the silicon pellet which is to be bonded to the substrate by using the adhesive glass film of the low melting point.

The invention will be better understood from the following description made in conjunction with the accompanying drawings, in which.

Figure 1:
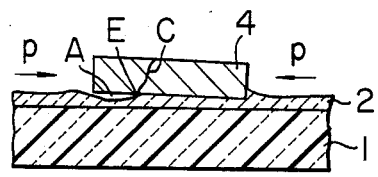
FIG. 1 is a sectional view showing a structure of a semiconductor device of the prior art.
Figure 2:
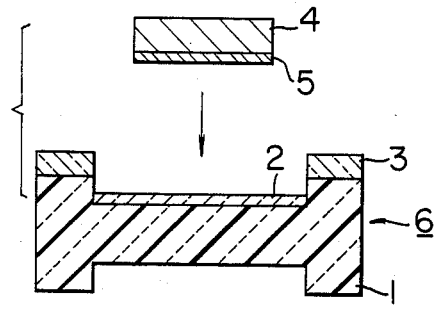
FIG. 2 shows in sections a semiconductor element and a base assembly in a separated state before being integrated into a semiconductor device according to an exemplary embodiment of the invention.
Figure 3:
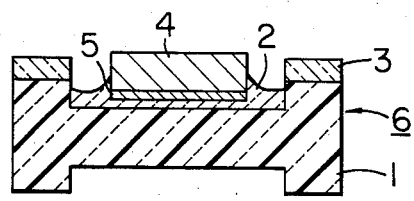
FIG. 3 shows in a sectional view the semiconductor device according to the invention in the state in which the semiconductor element is mounted on the base assembly.

Referring to FIGS. 2 and 3 which illustrate a semiconductor device according to an exemplary embodiment of the invention, wherein FIG. 2 shows a semiconductor element in the state before it is mounted on a mounting face or a base assembly of a package and FIG. 3 shows in section schematically the structure of the semiconductor device after the semiconductor element or pellet has been mounted, a reference numeral 1 denotes a ceramic substrate which constitutes a part of an intended ceramic package, and numeral 2 denotes a glass film of a low melting point for bonding the semiconductor element or the pellet to the substrate. The glass film 2 is formed on the substrate 1 at a cavity or recess portion at which the pellet 4 is to be mounted. For the glass film of the low melting point, a glass material having a bonding temperature of 550° C. or less (of which softening point is lower than about 500° C.) is selected. A typical example of such glass material may have a composition as follows:

| PbO | 70% by weight |
|---|---|
| B$_2$O$_3$ | 10% by weight |
| TiO$_2$ \} | |
| SiO$_2$ \} | 20% by weight |
| ZrO$_2$ \} | |

Further, the glass composition may contain PbTiO$_3$ as a filler for adjusting the thermal expansion coefficient which may be in the range of $5 \times 10^{-6}$/°C. to $6 \times 10^{-6}$/°C., for example. The bonding temperature of the glass composition is in the range of 400° C. to 450° C.

The glass film 2 of the low melting point may be applied onto the cavity portion through a known printing process.

Numeral 3 denotes a sealing glass film which may be of the same composition as that of the pellet bonding glass film 2 of the low melting point or differ from the latter. The ceramic substrate 1 and the low-melting-point glass films 2 and 3 may be referred to as the base assembly as a whole.

A reference numeral 4 denotes a silicon semiconductor element or silicon pellet to be connected and bonded to the glass film 2 at the cavity portion. It should be mentioned that a plurality of circuit elements such as MOS FET's are formed in the silicon pellet 4 through semiconductor integrated circuit techniques. This silicon pellet is of a size of $5.0 \times 5.0$ mm$^2$, for example. The thermal expansion coefficient of the silicon pellet itself is about $3.5 \times 10^{-6}$/°C.

A reference numeral 5 denotes a bond or adhesion reinforcing film deposited on the lower or bottom surface of the silicon pellet 4. The reinforcing film 5 may be constituted by a film of aluminium (Al) which is frequently used for forming wirings in the processes of manufacturing semiconductor devices. In the case of the illustrated structure, the bond or adhesion reinforcing film 5 is constituted by an aluminium film deposited through evaporation and having a thickness of about one micronmeter. The reinforcing film of aluminium may be formed through other processes such as a sputtering or the like.

The use of the evaporated aluminium film as the bond or adhesion reinforcing film 5 brings about an advantage that a same device for depositing aluminium through evaporation in the process of forming the wirings as described above can also be used for depositing the adhesion reinforcing film 5. The aluminium film 5 may contain several percentages by weight of silicon admixed. Further, the adhesion reinforcing film 5 may be formed of aluminium oxide Al$_2$O$_3$. It should have been mentioned that the adhesion reinforcing film 5 is at first formed over a whole surface of a large size wafer before the wafer is separated into the pellets of a small size through a scribing process or a dicing process. The individual pellets thus formed are usually checked as to electrical characteristics. In such case, it is desirable that the lower or bottom surface of the pellet is electrically conductive so that it may serve as an electrode during the test. Accordingly, the aluminium film is preferred to the Al$_2$O$_3$-film for the adhesion reinforcing film 5.

In addition to aluminium, the adhesion reinforcing film 5 may be formed of chromium (Cr), titanium (Ti) or copper (Cu). The metal film formed of such element is equally capable of exhibiting a high bonding strength in cooperation with the glass film 2 and thus suited for use as the adhesion reinforcing film 5. Further, the metal film formed of Cr, Ti or Cu can serve as the electrode in the check of the pellet, to an advantage. Among the metal films mentioned above, the aluminium film is preferred from the viewpoint of workability, adhesiveness and manufacturing cost.

The base assembly generally denoted by a reference numeral 6 has lead-out wires for external connection, although they are not shown in FIG. 2. Further, a ceramic cap (not shown) is bonded to the base assembly 6 by means of the glass film 3 of a low melting point, whereby the semiconductor element or pellet 4 is hermetically sealed.

Next, description will be made of a process for mounting the semiconductor element 4 onto the base assembly 6 according to the invention.

At the first step, the base assembly 6 constituted by the ceramic substrate 1 and the glass films 2 and 3 of the low melting point is heated to a work temperature (bonding temperature) of the glass films having the melting point in the range of 400° C. to 450° C. thereby to soften the glass film 2 of the low melting point. In this state, the semiconductor element or pellet 4 having the evaporated aluminium film 5 formed on the lower or bottom surface is positioned on the pellet mounting portion of the cavity 5 with the aid of a collet provided with vacuum suction means (not shown). Pressure on the order of 4 g/mm$^2$ is then applied onto the pellet 4 through the collet. Under the conditions, the whole structure is heated for a predetermied time, e.g. for one second so that the glass film 2 and the evaporated aluminium film 5 are fused together to be solidly bonded. After a cooling step, the process for mounting the semiconductor element 4 onto the pellet mounting face of the base assembly 6 is completed.

Figure 4:
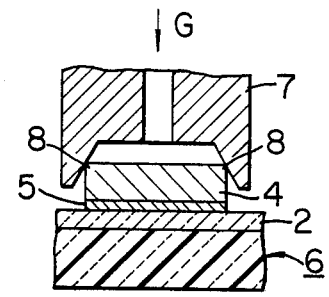
FIG. 4 shows in a sectional view a semiconductor device according to another embodiment of the invention.

By virtue of the use of the aluminium film 5 deposited on the lower or bottom surface of the pellet 4, the wettability and the adhesiveness of the glass film 2 to the aluminium film 3 are significantly enhanced. Accordingly, there is no necessity to apply a high pressure onto the pellet 4 in the heating and bonding phase. More specifically, since such high pressure G which causes the bottom portion of the silicon pellet 4 to be embedded in the bonding glass film 2 is not required according to the invention, edge portions 8 of the pellet 4 can be protected from cracks or damages which would otherwise be produced under pressure exerted by the collet 7 shown in FIG. 4. In contrast, according to the hitherto known method, it is required for the collet 7 to apply to the silicon pellet 4 a pressure of magnitude five or more times as high as the pressure required in the process according to the invention in order to embed the silicon pellet 4 in the glass film 2 because of inadequate bonding property of the glass film and the silicon pellet. Under the circumstance, crack is often produced in the pellets. According to the invention, rate of such failure can be significantly decreased, involving a high yield.

Since the evaporated aluminium film 5 is solidly bonded to the glass film 2 formed at the pellet mounting portion over the whole area of the aluminium film 5 according to the invention, thermal stress which may give rise to destruction of the semiconductor element will never be produced under any environmental conditions in which the semiconductor device is used. Thus, the semiconductor element 4 is mounted on the base assembly 6 or ceramic substrate in a very satisfactory manner.

According to the teaching of the present invention, it has been found possible to mount the silicon pellet of a size of about $3.0 \times 3.0$ mm$^2$ or more in square on the ceramic substrate by using the glass film without generation of cracks and destruction of the pellet. In the case of the illustrated embodiments described above, it has been assumed that the silicon pellet to be mounted is of a size of $5.0 \times 5.0$ mm$^2$. However, it will be readily understood that the silicon pellet of greater sizes can equally be mounted in a satisfactory manner. Further, it has been assumed in the foregoing description that the substrate for mounting thereon the silicon pellet is formed of ceramic. However, similar advantageous effects can be accomplished when beryllia is used in place of ceramic.

It will now be appreciated that, according to the invention, the semiconductor element can be positively and solidly mounted on a substrate in an inexpensive manner without requiring use of noble metals such as gold or the like, whereby the semiconductor devices can be realized at much reduced manufacturing cost.

What is claimed is:

1. A semiconductor device, comprising:
   a ceramic substrate having a flat surface;
   a glass film of low melting point bonded to said flat surface of said ceramic substrate;
   a silicon pellet having an upper surface and a lower surface; and
   an adhesion reinforcing film formed on the lower surface of said silicon pellet, said adhesion reinforcing film cooperating with said glass film of low melting point to exhibit a bonding strength greater than the one produced through cooperation of silicon material of said silicon pellet and said glass film of low melting point, said adhesion reinforcing film adhering to said glass film of the low melting point, to thereby increase adhesion between the silicon pellet and the glass film as compared with the adhesion between the silicon pellet and glass film obtained without use of the adhesion reinforcing film, whereby delamination of the silicon pellet from the glass film and consequent cracking of the silicon pellet is prevented.

2. A semiconductor device according to claim 1, wherein said adhesion reinforcing film is constituted by a film of a material selected from the group consisting of aluminum and aluminum containing silicon.

3. A semiconductor device according to claim 1, wherein said adhesion reinforcing film is formed of a metal selected from a group consisting of chromium, titanium and copper.

4. A semiconductor device according to claim 1, wherein said adhesion reinforcing film is constituted by a film of aluminum oxide.

5. A semiconductor device according to any one of claims 1 to 4, wherein said glass film of low melting point has a softening point which is not higher than 500° C.

6. A semiconductor device according to claim 7, wherein said adhesion reinforcing film is made of a material selected from the group consisting of aluminum, aluminum containing silicon, chromium, titanium, copper and aluminum oxide.

7. A semiconductor device according to claim 6, wherein said adhesion reinforcing film is made of a material selected from the group consisting of aluminum, aluminum containing silicon and aluminum oxide.

8. A semiconductor device according to claim 6 or 7, wherein said glass film of low melting point has a softening point which is not higher than 500° C.

9. A semiconductor device according to claim 1, 3 or 7, wherein substantially the entire lower surface of the silicon pellet adheres to the glass film of low melting point through said adhesion reinforcing film.

* * * * *